(12) United States Patent
Wang et al.

(10) Patent No.: US 6,233,175 B1
(45) Date of Patent: May 15, 2001

(54) SELF-LIMITING MULTI-LEVEL PROGRAMMING STATES

(75) Inventors: Janet Wang, San Francisco; Ravi Sunkavalli, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/693,650

(22) Filed: Oct. 21, 2000

(51) Int. Cl.$^7$ .................................................. G11C 16/04
(52) U.S. Cl. ............................... 365/185.03; 365/185.24; 365/185.28
(58) Field of Search ...................... 365/185.03, 185.18, 365/185.24, 185.28, 185.33

(56) References Cited

U.S. PATENT DOCUMENTS

| | | | |
|---|---|---|---|
| 5,477,485 | * 12/1995 | Bergemont et al. | 365/185.24 |
| 5,566,125 | * 10/1996 | Fazio et al. | 365/45 |
| 5,757,699 | * 5/1998 | Takeshima et al. | 365/185.24 |
| 6,097,639 | * 8/2000 | Choi et al. | 365/185.28 |

* cited by examiner

*Primary Examiner*—Son Mai
(74) *Attorney, Agent, or Firm*—H. Donald Nelson (57) ABSTRACT

A method of programming flash EEPROM devices that provides self-limiting multi-level programming states. Each cell in the flash EEPROM device can be programmed to have one of multiple threshold voltages. Each cell to be programmed has a programming voltage applied to the gate, a programming voltage applied to the drain and bias voltage applied to either the source ($V_s$) or to the substrate ($V_{sub}$) or both. The bias voltages $V_s$ or $V_{sub}$ are determined during a precharacterization procedure and each desired threshold voltage has a corresponding bias voltage $V_s$ or $V_{sub}$ that provides the desired threshold voltage during the programming procedure. The bias voltages $V_s$ or $V_{sub}$ are selected to provide self-limiting programming by the effective vertical field $E_v = V_g - V_t -$ (either $V_s$ or $V_{sub}$), where $V_t$ increases during programming until the programming stops. The lateral field $E_l = V_d -$ (either $V_s$ and/or $V_{sub}$) is adjusted during programming to keep the lateral field $E_l$ equal to $V_d$.

9 Claims, 8 Drawing Sheets

SELF-LIMITING MULTI-LEVEL PROGRAMMING STATES

BACKGROUND OF THE INVENTION

1. Field of the Invention

This invention relates generally to the art of microelectronic integrated circuits. More specifically, this invention relates to the art of programming microelectronic flash Electrically Erasable Programmable Read-Only Memory (EEPROM) devices. Even more specifically, this invention relates to a method of programming microelectronic flash Electrically Erasable Programmable Read-Only Memory devices that provides self-limiting multi-level programming states.

2. Discussion of the Related Art

A microelectronic flash or block erase Electrically Erasable Programmable Read-Only Memory (Flash EEPROM) device includes an array of cells that can be independently programmed and read. The size of each cell and thereby the memory device are made small by omitting transistors known as select transistors that enable the cells to be erased independently. As a result, all of the cells must be erased together as a block.

A flash memory of this type includes individual Metal-Oxide-Semiconductor (MOS) field effect transistor memory cells, each of which includes a source, a drain, a floating gate and a control gate to which various voltages are applied to program the cell with a binary 1 or 0, to erase all of the cells as a block, to read the cell, to verify that the cell is erased or to verify that the cell is not overerased.

The memory cells are connected in an array of rows and columns, with the control gates of the cells in a row being connected to a respective wordline and the drains of the cells in a column being connected to a respective bitline. The sources of all the cells are connected together. This arrangement is known as a NOR memory configuration.

A cell is read by applying typically 5 volts to the wordline to which the control gate of the cell is connected, applying 1 volt to the bitline to which the drain of the cell is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. These applied voltages cause the electrons that were injected into the floating gate during programming to undergo Fowler-Nordheim tunneling from the floating gate through the thin tunnel oxide layer to the source. In another arrangement, applying a negative voltage on the order of −10 volts to the control gate, applying 5 volts to the source and allowing the drain to float also erases a cell. A further method of erasing a cell is by applying 5V to the P-well and −10 V to the control gate while allowing the source/drain to float.

A cell is programmed by applying a voltage, typically 9 volts to the control gate, applying a voltage of approximately 5 volts to the drain and grounding the source causing hot electrons to be injected from a drain depletion region into the floating gate. Upon removal of the respective programming voltages, the injected electrons are trapped in the floating gate creating a negative charge therein that increases the threshold voltage of the cell to a value in excess of approximately 4 volts.

Attempts have been made to selectively program cells having different threshold voltages. However, because of manufacturing tolerances cells can have different threshold voltages when programmed. Because of this, tight control of the programmed states is difficult to achieve.

Therefore, what is needed is a method of self-limiting multi-level programming states of microelectronic flash Electrically Erasable Programmable Read-Only Memory devices that provides tightly controlled different programmed $V_t$'s.

SUMMARY OF THE INVENTION

According to the present invention, the foregoing and other objects and advantages are obtained by a method of programming a flash EEPROM device to have multi-level programmed states.

In accordance with one aspect of the invention, a threshold voltage is selected for each cell and during programming a bias voltage is applied to the source of the cell to be programmed. The amount of the source bias voltage determines the level of the threshold voltage. The lateral field $E_l = V_d - V_s$ is adjusted to maintain the same during each of the programming steps.

In accordance with another aspect of the invention, the different source bias voltages are determined so that the programming is self-limiting by the effective vertical field $E_v = V_g - V_t - V_s$ wherein $V_t$ increases during programming until the programming stops.

In accordance with still another aspect of the invention, a threshold voltage is selected for each cell and during programming a bias voltage is applied to the substrate of the cell to be programmed. The amount of the substrate bias voltage determines the level of the threshold voltage. The lateral field $E_l = V_c - V_{sub}$ is adjusted to remain the same during each of the programming steps.

In accordance with still another aspect of the invention, the different substrate bias voltages are determined so that the programming is self-limiting by the effective vertical field $E_v = V_g - V_t - V_{sub}$ ($V_s = 0$), wherein $V_t$ increases during programming until the programming stops.

In accordance with still another aspect of the invention, a threshold voltage is selected for each cell and during programming a bias voltage is applied to both the substrate of the cell to be programmed. The amount of the substrate bias voltage and source bias voltages determines the level of the threshold voltage. The lateral field $E_l = V_c - V_{sub} - V_s$ is adjusted to remain the same during each of the programming steps.

In accordance with still another aspect of the invention, the different substrate bias voltages and source bias voltages are determined so that the programming is self-limiting by the effective vertical field $E_v = V_g - V_t - V_{sub} - V_s$, wherein $V_t$ increases during programming until the programming stops.

The described method thus provides self-limiting multi-level programming states in a flash EEPROM device.

The present invention is better understood upon consideration of the detailed description below, in conjunction with the accompanying drawings. As will become readily apparent to those skilled in the art from the following description, there is shown and described embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to a specific embodiments or specific embodiments of the present invention that illustrate the best mode or modes presently contemplated by the inventors for practicing the invention.

Figure 1A:
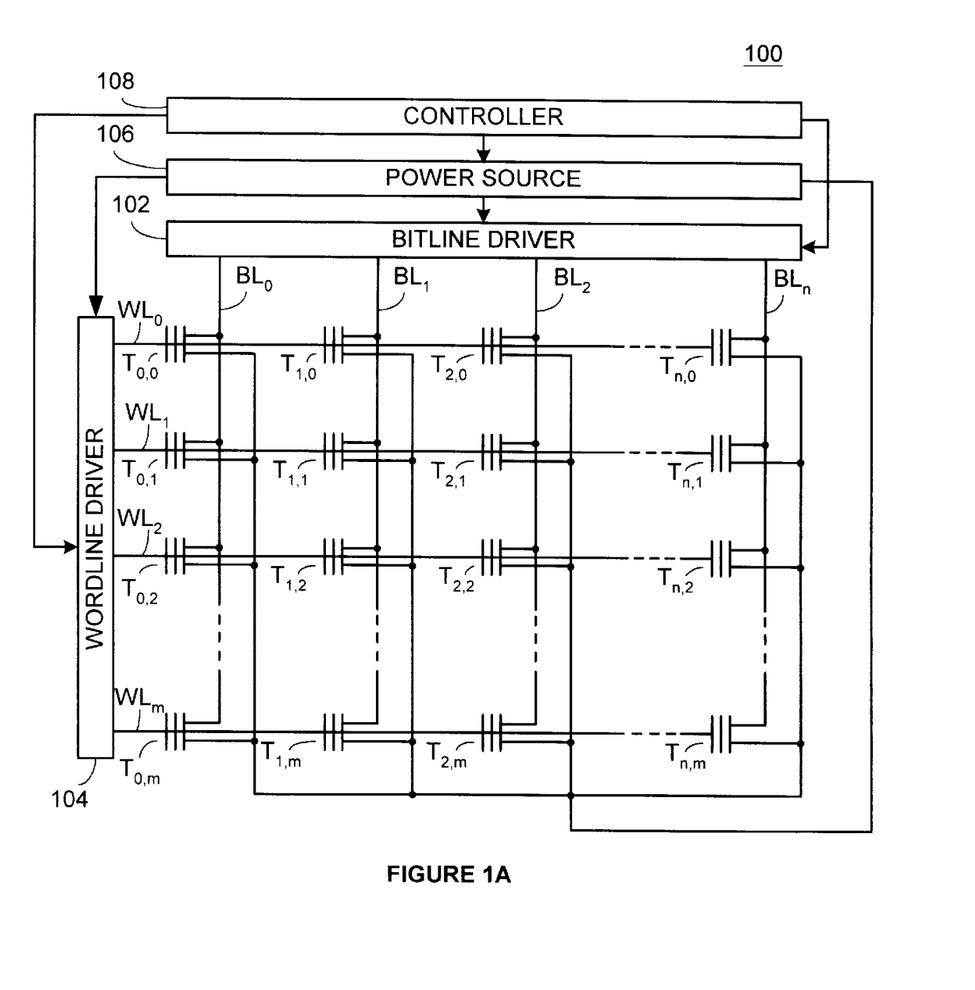
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines and a wordline driver 104 applies appropriate voltages to the wordlines. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A flash memory cell is located at each junction of a wordline and bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
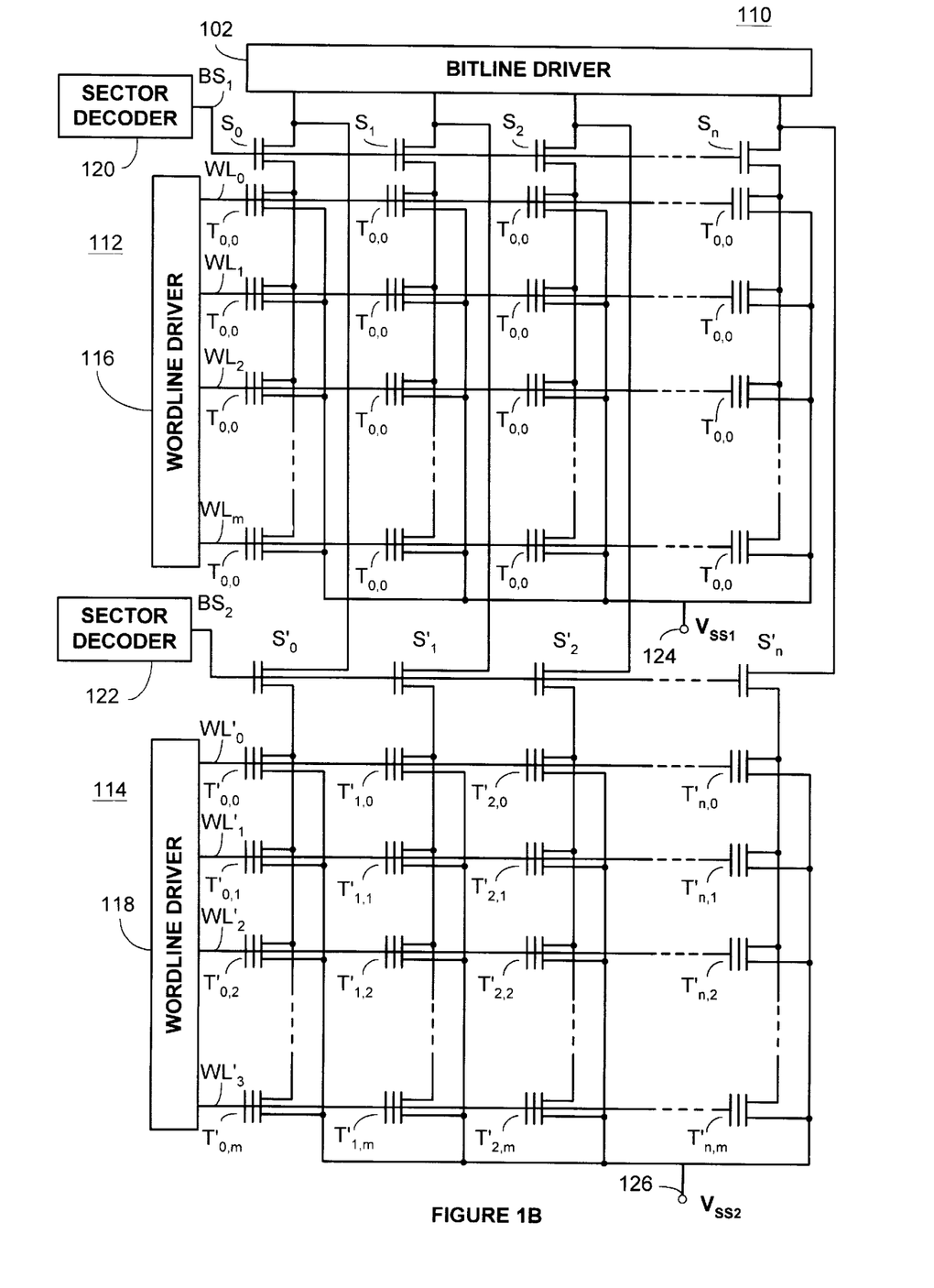
FIG. 1B is similar to FIG. 1A but illustrates a flash EEPROM having cells arranged in two pages or banks.

FIG. 1B illustrates another flash EEPROM memory 110 which is similar to the memory 100 except that the cells are divided into banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122.

The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $B_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal BS2 and select transistors $S'_0$ to $S'_n$. The operation of the memory 110 is essentially similar to that of the memory 100 (FIG. 1A), except that the program, erase and read operations can be performed on the banks 112 & 114 independently.

Figure 2A:
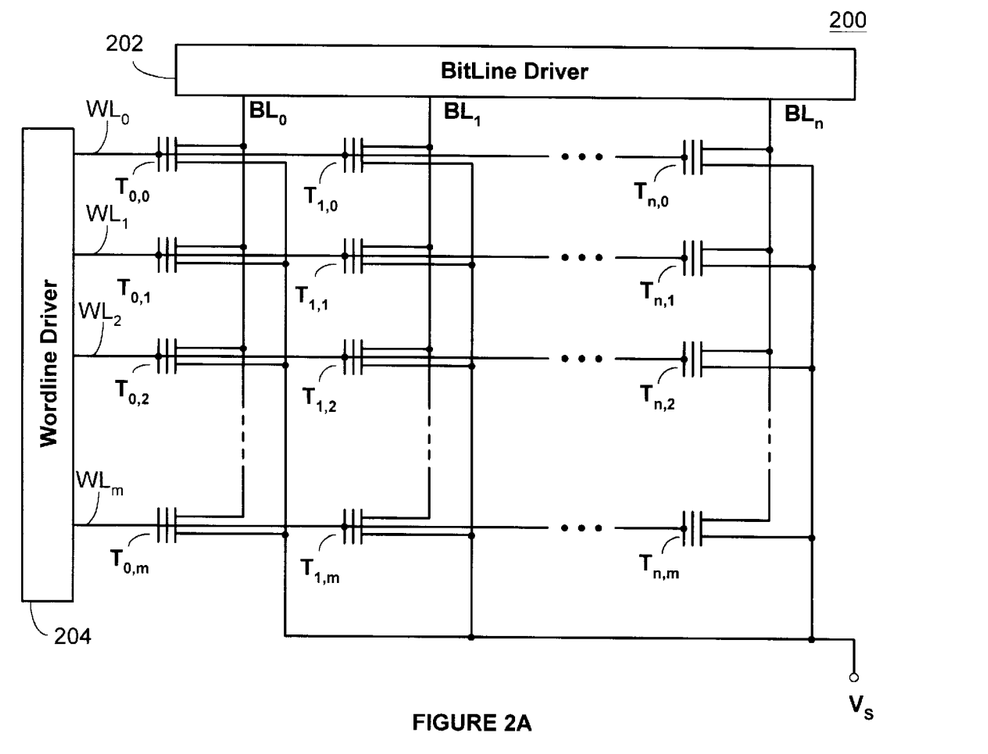
FIG. 2A is a simplified electrical schematic diagram of a portion of a flash EEPROM device showing a method of programming a cell.

FIG. 2A is a simplified electrical schematic diagram of a portion 200 of a flash EEPROM device. The portion 200 of the flash EEPROM device includes a bitline driver 202 that is connected to and controls bitlines $BL_0$, $BL_1$ through $BL_n$. The portion 200 of the flash EEPROM device also includes a wordline driver 204 that is connected to and controls wordlines $WL_0$, $W_1$, through $WL_1$. As discussed above, the cells illustrated in FIG. 2A are designated using the notation $T_{n,m}$. In order to program the cells in the portion 200 of a flash EEPROM device, all of the cells in the portion 200 of the flash EEPROM device are block erased and after all the cells in the portion 200 of the flash EEPROM device verify as erased, each of the cells in the portion 200 of the flash EEPROM are individually programmed. In order to program cell $T_{1,1}$, for example, bitline driver 202 puts a voltage on bitline $BL_1$, typically 5–7 volts, wordline driver 204 puts a voltage on wordline $WL_1$, typically 9–10 volts and the common source voltage $V_s$ is put at ground (0V).

Figure 2B:
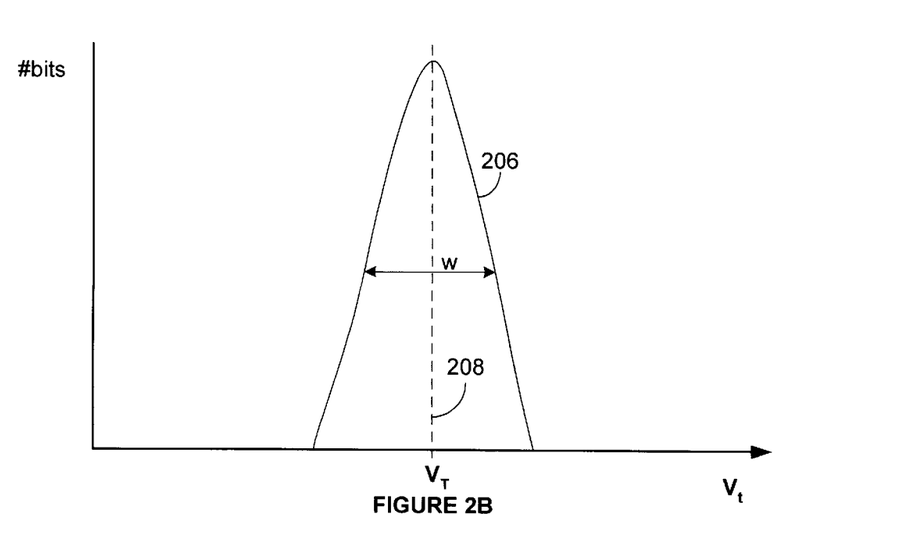
FIG. 2B shows the threshold voltage distribution resulting from a programming procedure of the portion of the flash EEPROM device shown in FIG. 2A.

FIG. 2B is a graph of the threshold voltage distribution. Each cell that is programmed will have a threshold voltage on the curve 206. It should be appreciated that the ideal threshold voltage distribution would be a straight line that would coincide with the dotted line 208. Therefore, the width w of the threshold voltage distribution curve is a measure of the quality of the cell, that is, the smaller the width w the better the cell quality.

Figure 3A:
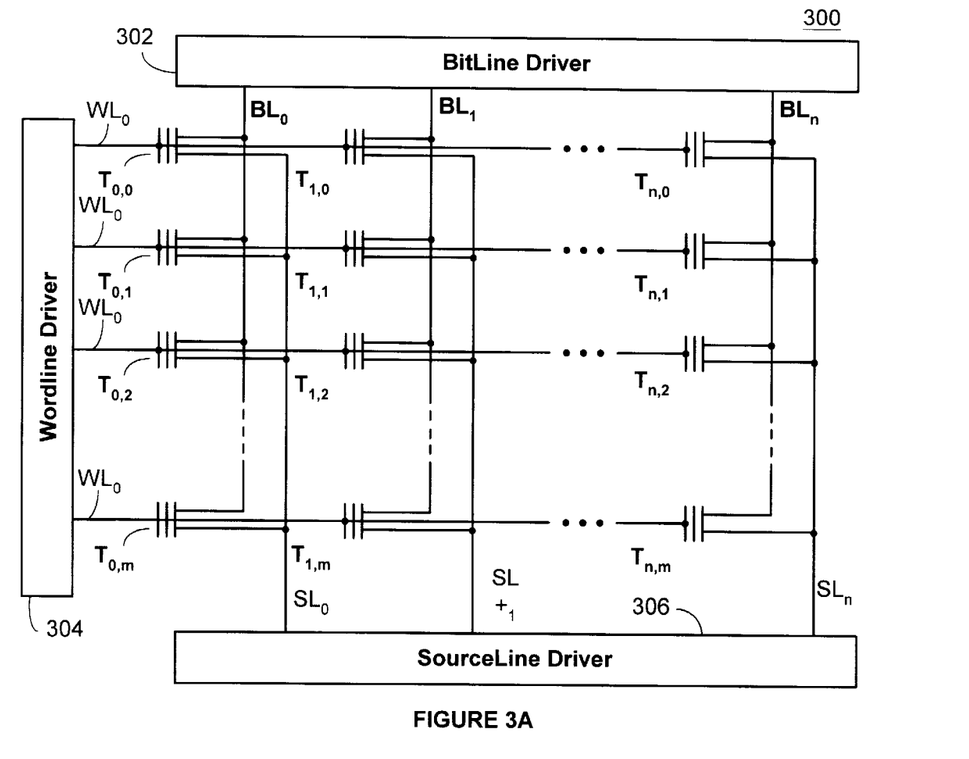
FIG. 3A is a simplified electrical schematic diagram of a portion of a flash EEPROM device showing a method of programming a cell with source bias to achieve tightly controlled multi-level programmed states.

FIG. 3A is a simplified electrical schematic of a portion 300 of a flash EEPROM device. The portion 300 of the flash EEPROM device includes a bitline driver 302 that is connected to and controls bitlines $BL_0$, $BL_1$ through $B_n$. The portion 300 of the flash EEPROM device also includes a wordline driver 304 that is connected to and controls wordlines $WL_0$, $WL_1$ through $WL_m$. The portion 300 of the flash EEPROM device also includes a sourceline driver 306 that is connected to and controls sourcelines $SL_0$, $SL_1$ through $SL_n$. As discussed above, the cells illustrated in FIG. 3A are designated using the notation $T_{n,m}$. In order to program the cells in the portion 300 of a flash EEPROM device, all of the cells in the portion 300 of the flash EEPROM device are block erased and after all the cells in the portion 300 of the flash EEPROM device verify as erased, each of the cells in the portion 300 of the flash EEPROM are individually programmed. Each cell in the portion 300 of the flash EEPROM device shown in FIG. 3A can be selectively programmed to have one of a multiple number of threshold voltages. Multi-level threshold voltages require tight control of the programmed states. Tight control of the programmed states is achieved by controlling the vertical and horizontal electric fields. The effective vertical field $E_v$ is:

$$E_v = V_g - V_t - V_s,$$

where $V_g$ is the voltage applied to the gate of the cell being programmed, $V_t$ is the threshold voltage of the cell being programmed and $V_s$ is the voltage applied to the source of the cell being programmed. The effective lateral field is:

$$E_l = V_d - V_s,$$

where $V_d$ is the voltage applied to the drain of the cell being programmed and $V_s$ is the voltage applied to the source of the cell being programmed.

Multi-level programmed states are controlled by using an appropriate source bias voltage during programming. The lateral field $E_l = V_d - V_s$ is adjusted to keep the same lateral field. That is, $V_d$ is increased when $V_s$ is applied so that $E_l$ remains the same. The programming is self-limiting by the value of the selected voltage applied to the source since the programming will slow as $V_t$ increases. By using different values of $V_s$, the programming can be tightly controlled to achieve different programmed $V_t$'s. The different values of $V_s$ that provide the alternate threshold voltages can be determined during a precharacterization procedure for each particular flash memory.

An example of three selected source voltages that provide three different threshold voltages when programming a flash memory device is to apply voltages of $V_s=1.5$, 1 or 0.5V to respective cells. When applying a voltage $V_s=1.5V$ to the source of a selected cell, the initial vertical field $E_v$ is therefore equal to $9-1.5-V_t=7.5-V_t$. The vertical field will decrease as $V_t$ increases and the programming will slow and will be self-limiting. Another cell may be required to have a different threshold voltage and a voltage of 1V will be applied to the source of the cell to be programmed. Therefore, the initial vertical field $E_v$ is equal to $9-1-V_t = 8-V_t$ and will be self-limiting to an alternate value of $V_t$. Similarly, another cell may have a voltage of 0.5V applied to the source and the programming will be self-limited to still another value of $V_t$.

Referring again to FIG. 3A, in order to program the cell $T_{1,I}$ to have a selected threshold voltage, the appropriate source voltage is applied to the sourceline $SL_1$ by the SourceLine Driver 306, the appropriate voltage $V_g$ is applied to the wordline $WL_1$ and the adjusted voltage $V_d-V_s$ is applied to the bitline $BL_1$ by the BitLine Driver 302.

Figure 3B:
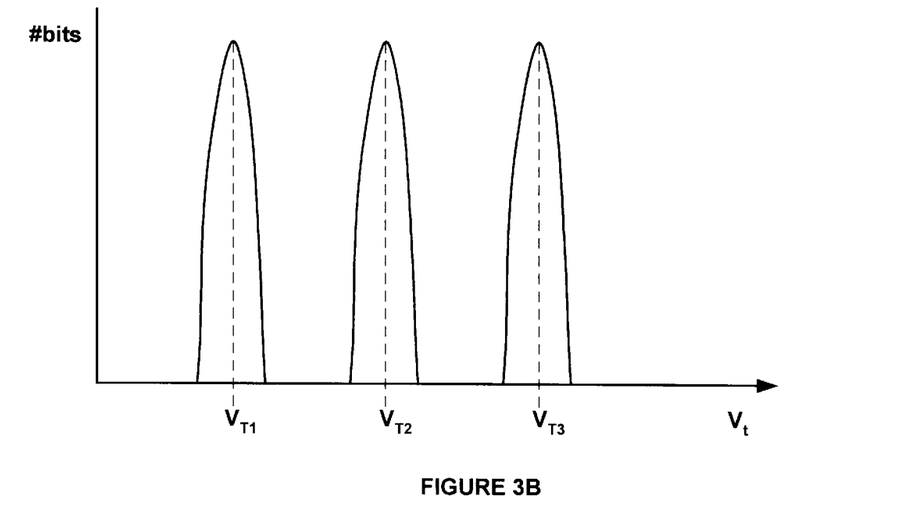
FIG. 3B (shows three levels of threshold voltages for cells shown in FIG. 3A.

FIG. 3B is a graph of the three threshold voltage distributions $V_{T1}$, $V_{T2}$ and $V_{T3}$ that are provided by the three source voltages discussed above. It should be appreciated that the three voltages are examples only and other voltages may be determined to provide other threshold voltages. It should also be appreciated that other numbers of threshold voltages are comprehended by this invention such as two or four alternative threshold voltages.

Figure 3C:
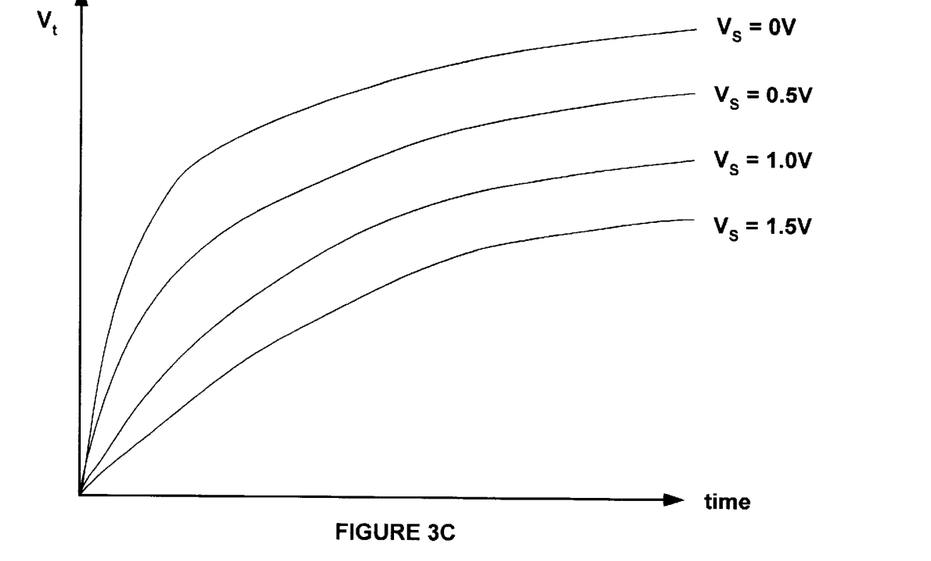
FIG. 3C shows threshold voltage vs. time curves for varying source bias voltages applied to selected cells.

FIG. 3C shows threshold voltage vs. time curves for varying source bias voltages applied to cells being programmed. These curves can be determined during a pre-characterization procedure and can serve as a determination of how long a cell should be programmed to achieve a desired threshold voltage.

Figure 4A:
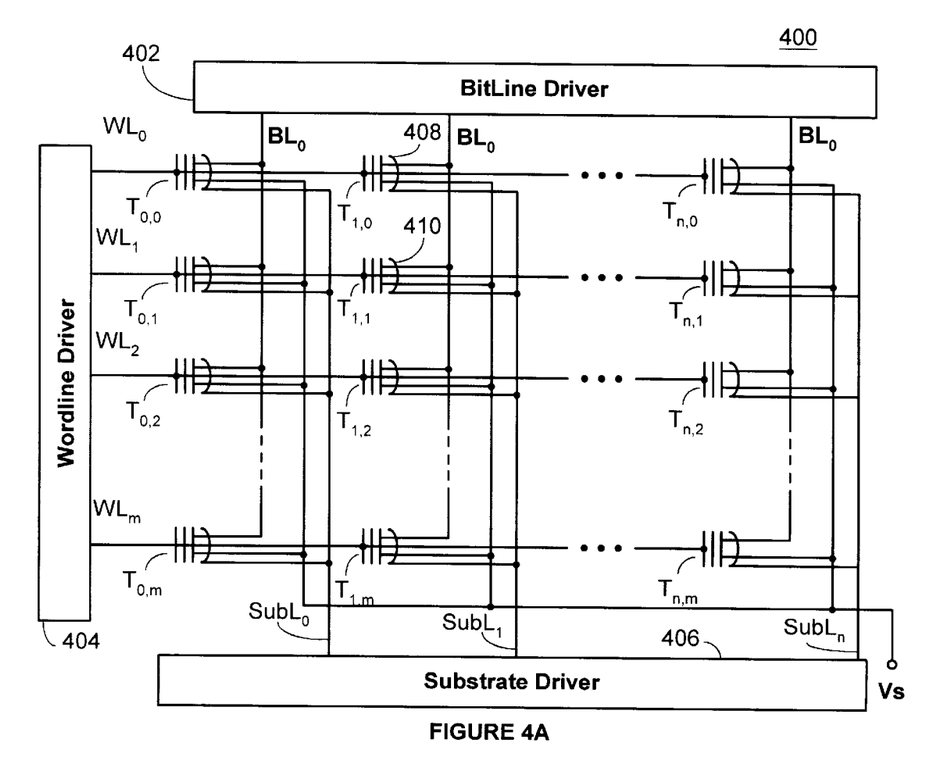
FIG. 4A is a simplified electrical schematic diagram of a portion of a flash EEPROM device showing a second method of programming a cell with substrate bias to achieve tightly control multi-level programmed states.

FIG. 4A is a simplified electrical schematic of a portion 400 of a flash EEPROM device. The portion 400 of the flash EEPROM device includes a bitline driver 402 that is connected to and controls bitlines $BL_0$, $BL_1$ through $BL_n$. The portion 400 of the flash EEPROM device also includes a wordline driver 404 that is connected to and controls wordlines $WL_0$, $WL_1$ through $WL_m$. The portion 400 of the flash EEPROM device also includes a substrate driver 406 that is connected to and controls substrate lines $SubL_0$, $SubL_1$, through $SubL_n$. Each substrate line is connected to the substrate of each cell in a column. For example, substrate line $SubL_0$ is connected to the substrate 408 of cell $T_{1,0}$, to substrate 410 of cell $T_{1,1}$, etc. The substrate lines are connected to wells in which respective flash cells are manufactured. As discussed above, the cells illustrated in FIG. 4A are designated using the notation $T_{n,m}$. In order to program the cells in the portion 400 of a flash EEPROM device, all of the cells in the portion 400 of the flash EEPROM device are block erased and after all the cells in the portion 400 of the flash EEPROM device verify as erased, each of the cells in the portion 400 of the flash EEPROM device are individually programmed. Each cell in the portion 400 cell in the portion 400 of the flash EEPROM device shown in FIG. 4A can be selectively programmed to have one of a multiple number of threshold voltages. As discussed above, multi-level threshold voltages require tight control of the programmed states. Tight control of the programmed states is achieved by controlling the vertical and horizontal fields. The effective vertical field $E_v$ is:

$$E_v = V_g - V_t - V_{sub} - V_s,$$

where $V_g$ is the voltage applied to the gate of the cell being programmed, $V_t$ is the threshold voltage of the cell being programmed and $V_{sub}$ is the voltage applied to the substrate of the cell being programmed. The voltage applied to the source $V_s$ during programming is zero. The effective lateral field is therefore:

$$E_l = V_d - V_s - V_s,$$

where $V_d$ is the voltage applied to the gate of the cell being programmed, $V_s$ is the voltage applied to the source of the cell being programmed and $V_{sub}$ is the voltage applied to the substrate of the cell being programmed. Because $V_s$ is zero, the lateral electric field is:

$$E_l = V_d - V_s.$$

Multi-level programmed states are controlled by using an appropriate substrate bias voltage during programming. The lateral field $E_l = V_d - V_{sub}$ is adjusted to keep the same lateral field. That is, $V_d$ is increased when $V_{sub}$ is applied so that $E_l$ remains the same. The programming is self-limiting by the value of the selected voltage applied to the substrate since the programming will slow as $V_t$ increases during programming. By using different values of $V_{sub}$, the programming can be tightly controlled to achieve different programming $V_t$'s. The different values of $V_{sub}$ that provide the alternate threshold voltages can be determined during a precharacterization procedure for each particular flash memory.

Figure 4B:
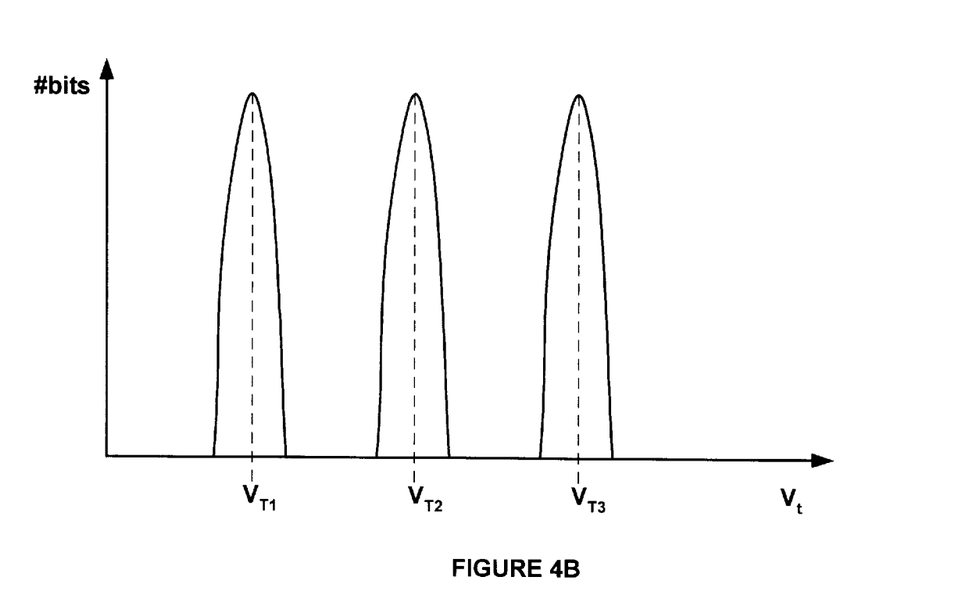
FIG. 4B shows three levels of threshold voltages for cells shown in FIG. 4A.

FIG. 4B is a graph of the three threshold voltage distributions $V_{T1}$, $V_{T2}$ and $V_{T3}$ that are provided by different substrate voltages. It should also be appreciated that other numbers of threshold voltages are comprehended by this invention such as two or four alternative threshold voltages.

Figure 4C:
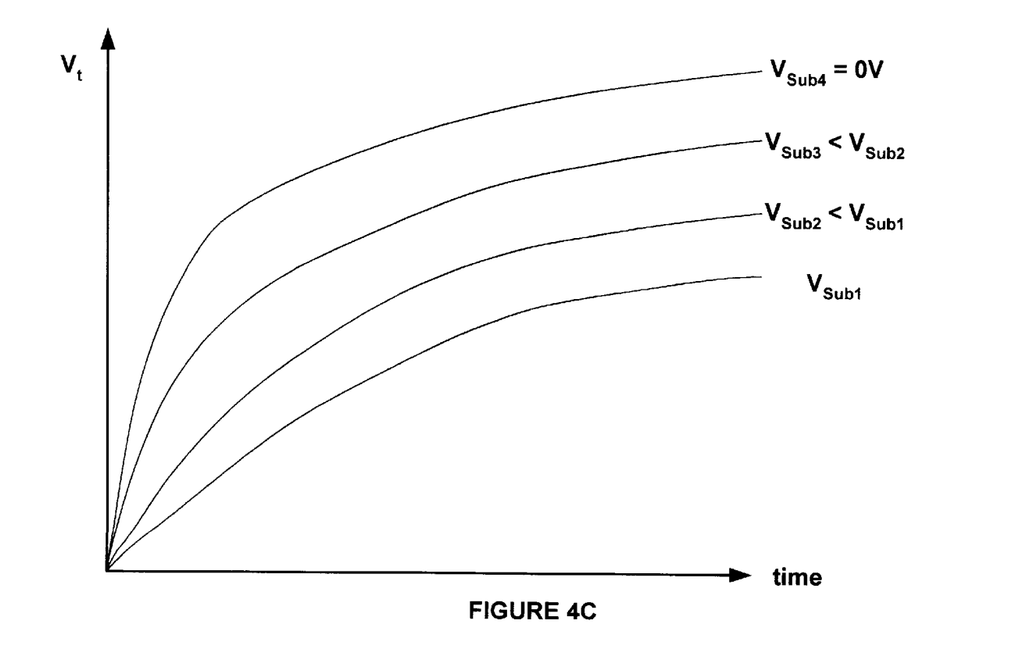
FIG. 4C shows threshold voltage vs. time curves for varying substrate bias voltages applied to selected cells.

FIG. 4C shows threshold voltage vs. time curves for varying substrate bias voltages applied to cells being programmed. These curves can be determined during a precharacterization procedure and can serve as a determination of how long a cell should be programmed to achieve a desired threshold voltage.

Figure 5A:
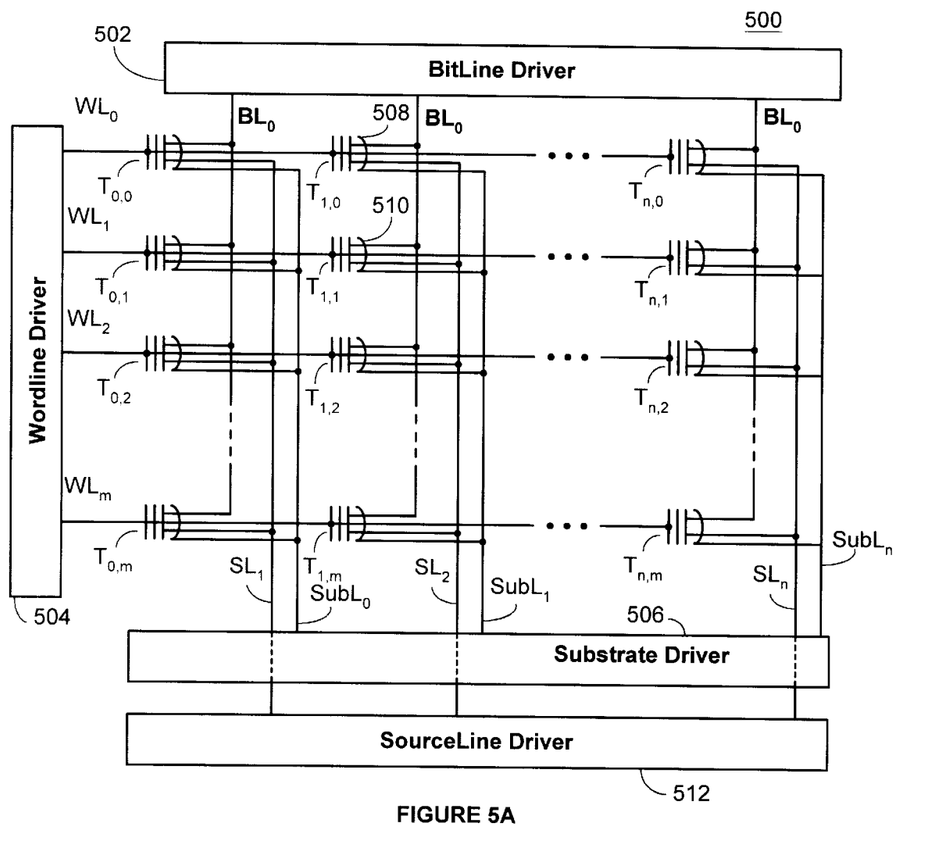
FIG. 5A is a simplified electrical schematic diagram of a portion of a flash EEPROM device showing a third method of programming a cell with substrate and source bias to achieve tight controlled multi-level programmed states.

FIG. 5A is a simplified electrical schematic of a portion 500 of a flash EEPROM device. The portion 500 of the flash EEPROM device includes a bitline driver 502 that is connected to and controls bitlines $BL_0$ $BL_1$ through $BL_n$. The portion 500 of the flash EEPROM device also includes a wordline driver 504 that is connected to and controls wordlines $WL_0$ $WL_1$ through $WL_m$. The portion 500 of the flash EEPROM device also includes a substrate driver 506 that is connected to and controls substrate lines $SubL_0$, $Sub_l$, and $SubL_n$. Each substrate line is connected to the substrate of each cell in a column. For example, substrate line $SubL_0$ is connected to the substrate 508 of cell $T_{1,0}$ to substrate 510 of cell $T_{1,1,}$ etc. The substrate lines are connected to wells in which respective flash cells are manufactured. The portion 500 of the flash EEPROM device also includes a sourceline driver 512 that is connected to and controls sourcelines $SL_1$, $SL_2$ through $SL_n$. In order to program the cells in the portion 500 of a flash EEPROM device, all of the cells in the portion 500 of the flash EEPROM device are block erased and after all the cells in the portion 500 of the flash EEPROM device verify as erased, each of the cells in the portion 500 of the flash EEPROM are individually programmed. Each cell in the portion 500 of the flash EEPROM device shown in FIG. 5A can be selectively programmed to have one of a multiple number of threshold voltages. Multi-level threshold voltages require tight control of the programming states. Tight control of the programming states is achieved by controlling the vertical and horizontal electric fields. The effective vertical field $E_v$ is:

$$E_v = V_g - V_t - V_{sub} - V_s,$$

where $V_g$ is the voltage applied to the gate of the cell being programmed, $V_t$ is the threshold voltage of the cell being programmed, $V_{sub}$ is the voltage applied to the substrate of the cell being programmed, and $V_s$ is the voltage applied to the source of cell being programmed. The effective lateral field is therefore:

$$E_l = V_d - V_s - V_{sub},$$

where $V_d$ is the voltage applied to the gate of the cell being programmed, $V_s$ is the voltage applied to the source of the cell being programmed and $V_{sub}$ is the voltage applied to the substrate of the cell being programmed.

Multi-level programmed states are controlled by using a combination of an appropriate substrate bias voltage and an appropriate source voltage during programming. The lateral field $E_l = V_d - V_{sub} - V_s$ is adjusted to keep the same lateral field. That is, $V_d$ is increased when $V_{sub} - V_s$ is applied so that $E_l$ remains the same. The programming is self-limiting by the value of the selected voltage applied to the substrate and source since the programming will slow as $V_t$ increases during programming. By using different values of $V_{sub}$ and $V_s$, the programming can be tightly controlled to achieve different programming $V_t$'s. The different values of $V_{sub} - V_s$ that provide the alternate threshold voltages can be determined during a precharacterization procedure for each particular flash memory.

Figure 5B:
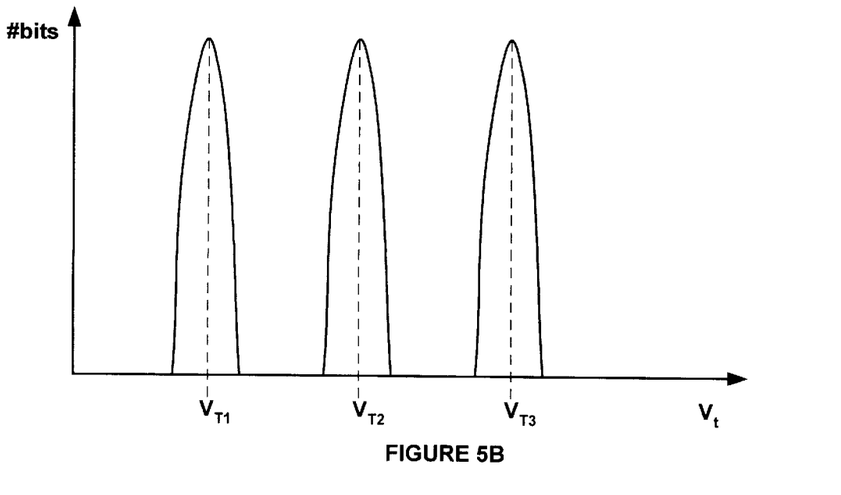
FIG. 5B shows three levels of threshold voltages for cells shown in FIG. 5A.

FIG. 5B is a graph of the three threshold voltage distributions $V_{T1}$, $V_{T2}$ and $V_{T3}$ that are provided by different substrate voltages. It should also be appreciated that other numbers of threshold voltages are comprehended by this invention such as two or four alternative threshold voltages.

Figure 5C:
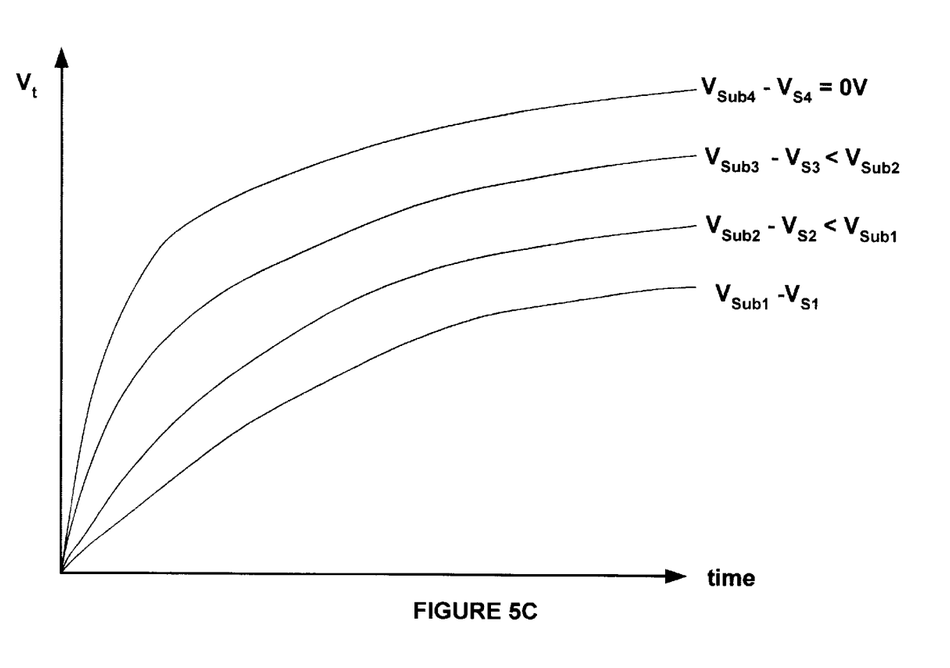
FIG. 5C shows threshold voltage vs. time curves for varying combinations of substrate bias and source bias applied to selected cells.

FIG. 5C shows threshold voltage vs. time curves for varying substrate bias voltages applied to cells being programmed. These curves can be determined during a precharacterization procedure and serve as a determination of how long a cell should be programmed to achieve a desired threshold voltage.

In summary, the present invention overcomes the limitations of the prior art and provides self-limiting multi-level programming states in a flash EEPROM device.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of programming a flash EEPROM device to have multi-level programmed states, the method comprising:

(a) selecting a cell in the flash EEPROM device to be programmed;

(b) selecting a threshold voltage to which the cell will be programmed, wherein the selected threshold voltage is selected from the group including $V_{t1}$, $V_{t2}$, and $V_{tn}$;

(c) applying a voltage $V_g$ to a gate of the cell to be programmed;

(d) applying a voltage $V_d$ to a drain of the cell to be programmed;

(e) applying a voltage $V_s$ to a source of the cell to be programmed, wherein the voltage $V_s$ is selected from the group $V_{s1}$, $V_{s2}$, and $V_{sn}$, wherein $V_{s1}$, $V_2$, and $V_{sn}$ result in threshold voltages $V_{t1}$, $Vt_2$, and $V_{tn}$, respectively; and (f) adjusting a lateral electric field, $E_l = V_d - V_s$, of the cell being programmed to keep the lateral electric field $E_l$ equal to $V_d$.

2. The method of claim 1 further comprising (g) repeating steps (a) through (f) until all cells in the flash EEPROM device have been programmed.

3. The method of claim 2 wherein $V_{s1}$, $V_{s2}$ and $V_{sn}$ are determined during a precharacterization procedure for the flash EEPROM device to be programmed, wherein $V_{s1}$, $V_{s2}$ and $V_{sn}$ are determined so that the programming is self-limiting by the effective vertical field $E_v = V_{g-Vt} - V_s$, wherein $V_t$ increases during programming until the programming stops.

4. A method of programming a flash EEPROM device to have multi-level programmed states, the method comprising:

(a) selecting a cell in the flash EEPROM device to be programmed;

(b) selecting a threshold voltage to which the cell will be programmed, wherein the selected threshold voltage is selected from the group including $V_{t1}$, $V_{t2}$, and $V_{tn}$;

(c) applying a voltage $V_g$ to a gate of the cell to be programmed;

(d) applying a voltage $V_d$ to a drain of the cell to be programmed;

(e) applying a voltage $V_{sub}$ to a substrate of the cell to be programmed, wherein the voltage $V_{sub}$ is selected from the group $V_{sub1}$, $V_{sub2}$ and $V_{subn}$, wherein $V_{sub1}$, $V_{sub2}$, and $V_{subn}$ result in threshold voltages $V_{t1}$, $V_{t2}$, and $V_{tn}$, respectively; and (f) adjusting a lateral electric field, $E_l = V_d - V_{sub}$, of the cell being programmed to keep the lateral electric field $E_l$ equal to $V_d$.

5. The method of claim 4 further comprising (g) repeating steps (a) through (f) until all cells in the flash EEPROM device have been programmed.

6. The method of claim 5 wherein $V_{sub1}$, $V_{sub2}$ and $V_{subn}$ are determined during a precharacterization procedure for the flash EEPROM device to be programmed, wherein $V_{sub1}$, $V_{sub2}$ and $V_{subn}$ are determined so that the programming is self-limiting by the effective vertical field $E_v = V_g - V_t - V_{sub}$, wherein $V_t$ increases during programming until the programming stops.

7. A method of programming a flash EEPROM device to have multi-level programmed states, the method comprising:

(a) selecting a cell in the flash EEPROM device to be programmed;

(b) selecting a threshold voltage to which the cell will be programmed, wherein the selected threshold voltage is selected from the group including $Vt_1$, $Vt_2$, and $V_{tn}$;

(c) applying a voltage $V_g$ to a gate of the cell to be programmed;

(d) applying a voltage $V_d$ to a drain of the cell to be programmed;

(e) applying a voltage $V_s$ to a source of the cell to be programmed and a voltage $V_{sub}$ to a substrate of the cell to be programmed, wherein the voltage $V_s$ is selected from the group $V_{s1}$, $V_{s2}$ and $V_{sn}$ and wherein the voltage $V_{sub}$ is selected from the group $V_{sub1}$, $V_{sub2}$ and $V_{subn}$ wherein $V_{sub1} - V_{s1}$, $V_{sub2} - V_{s2}$, and $V_{subn} - V_{sn}$ result in threshold voltages $V_{t1}$, $V_{t2}$, and $V_{tn}$, respectively; and (f) adjusting a lateral electric field, $E_l = V_d - V_{sub} - V_s$, of cell being programmed to keep the lateral electric field $E_l$ equal to $V_d$.

8. The method of claim 7 further comprising (g) repeating steps (a) through (f) until all cells in the flash EEPROM device have been programmed.

9. The method of claim 8 wherein $V_{sub1}$, $V_{sub2}$ and $V_{subn}$ and $V_{s1}$, $V_{s2}$ and $V_{sn}$ are determined during a precharacterization procedure for the flash EEPROM device to be programmed, wherein $V_{sub1}$, $V_{sub2}$ and $V_{subn}$ and $V_{s1}$, $V_{s2}$ and $V_{sn}$ are determined so that the programming is self-limiting by the effective vertical field $E_v = V_g - V_t - V_{sub} - V_s$, wherein $V_t$ increases during programming until the programming stops.

* * * * *